United States Patent [19]

Boultinghouse

[11] Patent Number: 4,540,631

[45] Date of Patent: Sep. 10, 1985

[54] TREATMENT OF POLYMER USING SILVER

[75] Inventor: Harold D. Boultinghouse, Bartlesville, Okla.

[73] Assignee: Phillips Petroleum Company, Bartlesville, Okla.

[21] Appl. No.: 479,243

[22] Filed: Mar. 28, 1983

[51] Int. Cl.³ .............................................. B32B 27/06
[52] U.S. Cl. .................................. 428/419; 427/125; 427/316; 428/457
[58] Field of Search ................ 427/316, 40, 125, 427, 427/443.1, 229, 388.2; 428/419, 457

[56] References Cited

U.S. PATENT DOCUMENTS

| | | |
|---|---|---|
| 2,622,041 | 12/1952 | Godley ................................. 427/318 |
| 2,924,535 | 2/1960 | Schaefer ............................... 427/229 |
| 3,028,622 | 4/1962 | Park ..................................... 427/316 |
| 3,326,719 | 6/1967 | Beltzer et al. ........................ 427/125 |
| 3,347,695 | 10/1967 | Stancell et al. ...................... 427/316 |
| 3,523,875 | 8/1970 | Minklei ................................. 427/125 |
| 4,075,388 | 2/1978 | Doss ..................................... 428/419 |
| 4,145,326 | 3/1979 | Blackwell ........................ 260/29.6 F |
| 4,370,469 | 1/1983 | Deguchi et al. ..................... 428/419 |

Primary Examiner—S. L. Childs
Attorney, Agent, or Firm—French and Doescher

[57] ABSTRACT

A method is provided by which a silver coating is applied to a polymeric substrate using an aqueous solution of silver nitrate. Also provided is a method for incorporation of silver as silver nitrate into a polymeric composition suitable for molding.

13 Claims, No Drawings

TREATMENT OF POLYMER USING SILVER

BACKGROUND OF THE INVENTION

The invention relates to the treatment of a material with silver. In one aspect the invention relates to the coating of a polymeric material with silver. In another aspect, the invention relates to the incorporation of silver in a moldable polymeric material.

It is known that a metal coating can be applied to the surface of a solid material. There are numerous utilities for the resulting metal-laminated object, depending upon the metal and substrate used. Silver is one metal which is, for certain utilities, desirable to coat on a polymeric surface. A silver coating might, for example, be applied to a polymeric surface to provide a laminate with an electrically conductive layer. Conventional methods to coat a surface with silver, however, are generaly somewhat complicated and time-consuming.

It is an object of the present invention to provide a simple method for coating a surface with silver. It is a further object to provide a method for treating a polymeric material to apply a thin film of silver on the surface thereof. In another embodiment, it is an object of the invention to provide a polymeric molding compound which has silver incorporated therein.

BRIEF SUMMARY OF THE INVENTION

According to the invention, a solid object is coated with silver by a process comprising contacting a wettable surface of the object with a solution of silver nitrate ($AgNO_3$) and heating the thus-contacted surface to a temperature effective to deposit a silver film on the object. The $AgNO_3$ is preferably in the form of an aqueous solution. A silver coating can generally be established by heating the contacted surface to a temperature of 350° to 500° F. Suitable substrate materials include polyolefins and polymeric thermoplastics, including poly(phenylene sulfide).

In a second embodiment of the invention, $AgNO_3$ is physically incorporated in a polymeric material, and the resulting compound can be further processed, such as by extrusion, to produce an article having silver dispersed throughout.

DETAILED DESCRIPTION OF THE INVENTION

Any suitable solid polymeric material can be coated with silver according to the invention method. Particularly suitable materials include thermoplastic polymers, including polyethylene, polypropylene, poly(phenylene sulfide) and copolymers comprising these. Thermoplastic polymers and copolymers of olefinic monomers are included within the scope of materials suitable for coating by the invention method. Polymers and copolymers comprising aromatic sulfides, such as poly(arylene sulfide) are also suitable. A particularly preferred material to coat according to the invention method has been found to be poly(phenylene sulfide), a thermoplastic polymer having alternating phenyl and sulfide groups.

$AgNO_3$ is used as the silver-depositing agent. Other nitrates such as zinc, copper, and tin nitrates, were tried using the invention method and were found inferior to silver in depositing a metallic coating on a poly(phenylene sulfide) substrate. It is preferred that the silver nitrate be applied to the substrate in the form of an aqueous solution. The concentration of silver nitrate in the solution is not critical and can be selected to produce the quality of coating desired. On a molar basis, solutions in the range of about 0.005 to about 3 M are effective in producing a silver-containing layer on the substrate. For most purposes, solutions having a $AgNO_3$ concentration in the range of about 0.05 to about 2 M will be suitable.

The surface to be coated is contacted with the solution of $AgNO_3$. The method of contacting is not critical, and suitable methods include dipping, brushing, and spraying.

Optionally and preferably, the polymeric surface to be coated will be made water-wettable, i.e. treated to render the surface more receptive to the aqueous solution and more capable of overcoming the surface tension of the aqueous solution. Methods such as flame treatment or corona discharge can be used. One suitable flame treatment method involves passing a 10% excess of air-to-methane oxidizing flame over the surface for a time sufficient to alter the surface characteristics as confirmed by reduction or elimination of beading of a water drop on the surface.

The area to which the solution of $AgNO_3$ has been applied can then be heated, if necessary to a temperature effective for depositing a solid layer of silver on the treated surface. The temperature used will depend upon the substrate being treated. For example, a suitable temperature for depositing silver onto a poly(phenylene sulfide) substrate will generally be at least about 350° F., and will generally range from about 400° to about 700° F.

The treated surface is then permitted to cool to ambient temperature. A coating of silver will adhere to the solid object, the thickness of the coating depending generally upon the concentration of $AgNO_3$ used.

A thus-coated solid object can be used in applications requiring a polymeric material having an electrically conductive coating. Such applications include microcircuitry for printed circuit boards and radio frequency shielding, in addition to decorative utilities.

According to the second embodiment, the silver can be incorporated in any suitable material requiring evenly-dispersed silver. Extrudable polymeric materials are suitable. Preferred extrudable materials include polyolefins and poly(arylene sulfide)s. Polyethylene, polypropylene and poly(phenylene sulfide) are extrudable materials in which $AgNO_3$ can be incorporated to produce a silver-containing extruded article according to the invention.

A silver salt, such as $AgNO_3$, is physically blended within the polymeric material to be treated. Methods of such application include spraying, dipping or brushing a liquid solution of a silver salt onto solid polymer in the form, for example, of pellets or incorporating a silver salt in a solid form in a finely-divided or liquefied polymeric resin. The polymeric resin is then molded into formed parts. This can be accomplished by any suitable molding method, such as extrusion. For example, poly(phenylene sulfide) pellets in solid form can be dipped in or sprayed with an aqueous solution of $AgNO_3$ and then melt extruded into formed parts. The resulting solid article contains dispersed silver and is characterized by a color change and a reduction in sulfurous odor. The thus-treated molded article can be used for any purpose requiring a chemically-resistant plastic article, such as radio frequency shielding.

EXAMPLE

A series of experiments was done to demonstrate the operability of the invention method of silver-coating a polymer.

A 1-g sample of silver nitrate salt was placed in a beaker. Distilled water (3 cc) was added to the beaker with stirring to produce a creamy white solution approximately 2M in silver nitrate.

A sample of Ryton® poly(phenylene sulfide), a product of Phillips Petroleum Company, was flame treated with an oxygen-rich flame to render the surface water-wettable. On this surface was applied, using a cotton swab, the sodium nitrate solution in an "S" pattern.

An additional 3 cc of distilled water was added to the beaker solution to produce a 1 M silver nitrate solution. This solution was also applied to the flame-treated surface in an "S" pattern.

An additional 54 cc of distilled water was added to the beaker solution resulting in an approximately 0.1 M solution. This solution was applied to a second poly(phenylene sulfide) slab having the same characteristics as the first.

An additional 640 cc of distilled water was added to the beaker solution to produce an approximately 0.01 molar solution, which was applied to the second poly(phenylene sulfide) slab.

After the samples were essentially dry, an oxygen-rich flame was passed over them. The 2M solution resulted in a slight rainbow-colored silver deposit having a crystalline surface appearance. The 1 M solution was similar, with less of a crystalline effect. Under a low-powered microscope, the surface appeared to be coated with silver. The 0.1 molar sample resulted in a very fine silver deposit on the polymer surface. The 0.01 solution deposited a barely-visible silver layer which had a bluish hue.

I claim:

1. A method for applying a silver coating to a poly(arylene sulfide) substrate, the method comprising
   applying to a surface of the poly(arylene sulfide) substrate treating materials consisting essentially of an aqueous solution consisting essentially of $AgNO_3$; and
   heating the thus-treated surface to a temperature effective for producing a silver coating on the surface of the poly(arylene sulfide) substrate.

2. The method of claim 1 in which the surface is heated to a temperature of at least about 350° F.

3. The method of claim 2 in which the surface is heated to a temperature of about 350° F.

4. The method of claim 1 in which the $AgNO_3$ solution has a concentration within the range of about 0.01 to about 2 M silver nitrate.

5. A method for applying a silver coating to a poly(arylene sulfide) substrate comprising the steps of
   increasing the surface wettability of a surface of the poly(arylene sulfide) substrate to be coated, and
   apply treating materials consisting essentially of an aqueous solution consisting essentially of $AgNO_3$ to the surface at a temperature effective for causing the deposition of a silver coating onto the surface.

6. The method of claim 5 in which the surface is at a temperature of at least about 350° F.

7. The method of claim 6 in which the surface is at a temperature of from about 350° F. to about 500° F.

8. The method of claim 5 in which the surface wettability of the surface to be coated is raised by contacting the surface with a flame.

9. The method of claim 5 in which the surface wettability of the surface to be coated is raised by contacting the surface with a methane flame for a time sufficient to eliminate beading of a water drop on the surface.

10. The method of claim 8 in which the aqueous $AgNO_3$ solution has a concentration of about 0.01 to about 2M silver nitrate.

11. The method of claim 8 in which the polymeric substrate comprises poly(phenylene sulfide).

12. An article of manufacture comprising poly(arylene sulfide) having a silver coating applied according to the method of claim 1

13. An article of manufacture comprising poly(arylene sulfide) and silver deposited on the poly(arylene sulfide) according to the method of claim 5.

* * * * *